United States Patent
Ordonez et al.

(10) Patent No.: US 11,056,602 B2
(45) Date of Patent: Jul. 6, 2021

(54) DEVICE, SYSTEM, AND METHOD FOR SELECTIVELY TUNING NANOPARTICLES WITH GRAPHENE

(71) Applicant: Naval Information Warfare Center, Pacific, San Diego, CA (US)

(72) Inventors: Richard C. Ordonez, Mililani, HI (US); Carlos M. Torres, Jr., San Diego, CA (US); Cody K. Hayashi, Waipahu, HI (US); David Garmire, Honolulu, HI (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 60 days.

(21) Appl. No.: 16/447,652

(22) Filed: Jun. 20, 2019

(65) Prior Publication Data
US 2020/0403106 A1 Dec. 24, 2020

(51) Int. Cl.
*H01L 31/0328* (2006.01)
*H01L 31/101* (2006.01)
(Continued)

(52) U.S. Cl.
CPC ...... *H01L 31/101* (2013.01); *H01L 21/02376* (2013.01); *H01L 21/02603* (2013.01);
(Continued)

(58) Field of Classification Search
CPC ............. H01L 31/02165; H01L 31/028; H01L 31/1804; H01L 31/1136; H01L 29/1606; H01L 31/0352; H01L 21/02603; H01L 31/035209; H01L 31/09; H01L 31/101; H01L 21/02527; H01L 31/035218; H01L 31/113; H01L 21/02376; H01L 31/1013; H01L 31/1016; H01L 21/0259; H01L 31/02162; H01L 31/03845; H01L 31/18
See application file for complete search history.

(56) References Cited

U.S. PATENT DOCUMENTS 7,301,199 B2 11/2007 Lieber et al.
8,575,663 B2 11/2013 Lieber et al.
(Continued)

OTHER PUBLICATIONS

Lee, J. et al., "Switching Individual Quantum Dot Emission through Electrically Contain ResonantEnergy Transfer to Graphene", Nano Letters, vol. 14 (12), pp. 7115-7119, Nov. 10, 2014.
(Continued)

*Primary Examiner* — Shouxiang Hu
(74) *Attorney, Agent, or Firm* — Naval Information Warfare Center, Pacific; Kyle Eppele; James R. McGee

(57) ABSTRACT

A graphene device for filtering color, involving a graphene structure responsive to continuous in-situ electrical gate-tuning of a Fermi level thereof and a plurality of nanoparticles disposed in relation to the graphene structure, each portion of the plurality of nanoparticles having a distinct energy bandgap in relation to another portion of the plurality of nanoparticles, and each portion of the plurality of nanoparticles configured to one of activate and deactivate in relation to the distinct energy bandgap and in response to the in-situ electrical gate-tuning of the Fermi level of the graphene structure.

18 Claims, 4 Drawing Sheets

(51) Int. Cl.
*H01L 31/0216* (2014.01)
*H01L 31/028* (2006.01)
*H01L 31/18* (2006.01)
*H01L 31/113* (2006.01)
*H01L 21/02* (2006.01)
*H01L 31/0352* (2006.01)
*H01L 31/09* (2006.01)
*H01L 29/16* (2006.01)

(52) U.S. Cl.
CPC ...... *H01L 31/028* (2013.01); *H01L 31/02165* (2013.01); *H01L 31/0352* (2013.01); *H01L 31/09* (2013.01); *H01L 31/1136* (2013.01); *H01L 31/1804* (2013.01); *H01L 29/1606* (2013.01)

(56) References Cited

U.S. PATENT DOCUMENTS

| | | | |
|---|---|---|---|
| 8,916,947 B2 | 12/2014 | Sargent et al. | |
| 8,926,933 B2 | 1/2015 | Zhang et al. | |
| 9,130,085 B2 | 9/2015 | Colli | |
| 9,196,766 B1 * | 11/2015 | Egerton | H01L 31/101 |
| 9,349,170 B1 | 5/2016 | Klem et al. | |
| 9,362,519 B2 | 6/2016 | Siegel et al. | |
| 9,481,949 B2 | 11/2016 | Zhang et al. | |
| 9,491,388 B2 | 11/2016 | Sargent et al. | |
| 9,512,545 B2 | 12/2016 | Zhang et al. | |
| 9,535,063 B2 | 1/2017 | Lieber et al. | |
| 9,605,363 B2 | 3/2017 | Zhang et al. | |
| 9,627,562 B2 * | 4/2017 | Zhang | H01L 29/7781 |
| 9,631,301 B2 | 4/2017 | Zhang et al. | |
| 9,688,536 B2 | 6/2017 | Zhang et al. | |
| 9,815,699 B1 | 11/2017 | Zhang et al. | |
| 9,845,554 B2 | 12/2017 | Zhang et al. | |
| 9,862,607 B2 | 1/2018 | Zhang et al. | |
| 9,944,529 B2 | 4/2018 | Zhang et al. | |
| 9,972,652 B2 | 5/2018 | Sargent et al. | |
| 10,196,271 B2 | 2/2019 | Zhang et al. | |
| 2003/0089899 A1 | 5/2003 | Lieber et al. | |
| 2006/0175601 A1 | 8/2006 | Lieber et al. | |
| 2007/0281156 A1 | 12/2007 | Lieber et al. | |
| 2008/0170982 A1 | 7/2008 | Zhang et al. | |
| 2009/0057650 A1 | 3/2009 | Lieber et al. | |
| 2010/0152057 A1 | 6/2010 | Lieber et al. | |
| 2010/0155698 A1 | 6/2010 | Lieber et al. | |
| 2011/0309462 A1 | 12/2011 | Sargent et al. | |
| 2013/0193404 A1 * | 8/2013 | Koppens | H01L 31/0547 257/9 |
| 2014/0080139 A1 | 3/2014 | Lieber et al. | |
| 2015/0147573 A1 | 5/2015 | Zhang et al. | |
| 2015/0208011 A1 | 7/2015 | Sargent et al. | |
| 2015/0308018 A1 | 10/2015 | Zhang et al. | |
| 2016/0083872 A1 | 3/2016 | Zhang et al. | |
| 2016/0251778 A1 | 9/2016 | Zhang et al. | |
| 2016/0273133 A1 | 9/2016 | Zhang et al. | |
| 2016/0312387 A1 | 10/2016 | Zhang et al. | |
| 2017/0001866 A1 | 1/2017 | Zhang et al. | |
| 2017/0069679 A1 | 3/2017 | Sargent et al. | |
| 2017/0096750 A1 | 4/2017 | Zhang et al. | |
| 2017/0137290 A1 | 5/2017 | Zhang et al. | |
| 2017/0327377 A1 | 11/2017 | Zhang et al. | |
| 2017/0352492 A1 | 12/2017 | Tang et al. | |
| 2018/0066383 A1 | 3/2018 | Bakr et al. | |
| 2019/0002283 A1 | 1/2019 | Zhang et al. | |

OTHER PUBLICATIONS

Tielrooij, K. J. et al., "Electrical Control of Optical Emitter Relaxation Pathways Enabled by Graphene", Nature Physics, vol. 11, pp. 281-287, Jan. 19, 2015.

Ma, Q. et al., "Tuning Ultrafast Electron Thermalization Pathways in a van der Waals Heterostructure", Nature Physics, vol. 12, pp. 455-459, Jan. 18, 2016.

Dicken, M. J. et al., "Frequency Tunable Near-Infrared Metamaterials Baed on VO2 Phase Transition," Optics Express, vol. 17 No. 20, pp. 18330-18339, Sep. 28, 2009.

* cited by examiner

DEVICE, SYSTEM, AND METHOD FOR SELECTIVELY TUNING NANOPARTICLES WITH GRAPHENE

FEDERALLY-SPONSORED RESEARCH AND DEVELOPMENT

The United States Government has ownership rights in the subject matter of the present disclosure. Licensing inquiries may be directed to Office of Research and Technical Applications, Naval Information Warfare Center, Pacific, Code 72120, San Diego, Calif., 92152; telephone (619) 553-5118; email: ssc_pac_t2@navy.mil. Reference Navy Case No. 105127.

TECHNICAL FIELD

The present disclosure technically relates to color filtration. Particularly, the present disclosure technically relates to color filtration for photodetection.

BACKGROUND OF THE INVENTION

In the related art, monolayer graphene absorbs approximately 2.3% of normally incident electromagnetic radiation in the visible spectrum to the infrared spectrum. However, to obtain multispectral selectivity, graphene requires a color filter for imaging purposes. Color filters are used in imagers, displays, and even communication devices. Color filters are traditionally implemented with physical Bayer masks or mechanical gratings that add additional weight or payload and volume to a filter system. This additional payload is detrimental in implementations that require minimal size, weight, and power (SWaP). In order to satisfy low SWaP requirements, optically tuning metamaterials and nanomaterials have been explored in the related art. For example, frequency tuning metamaterials through temperature variance has been researched. Yet, for temperature-sensitive implementations, such as imaging, this frequency tuning requires bulky and high power-consuming heating and cooling equipment.

Also in the related art, the resonance formed between graphene and nanoparticles has been studied, notably the high-gain photodetection that is produced by the combination of graphene and nanoparticles. Although tuning the nanoparticle's energy transfer relaxation pathway to graphene by electrically varying the Fermi level of graphene has been observed in relation to activating and deactivating a single nanoparticle, the related art has not been able to use such technique for color filtration. While the related art has observed that the differential photocurrent of two sections of graphene, each contacting a different-sized nanoparticle, creates a narrow bandwidth photo-response that falls between the corresponding frequencies of both nanoparticles, the frequency range would be fixed once a device is fabricated, and, thus, is not variable with gate voltage. Such related art techniques are unable to tune the graphene's photo-response to specific frequencies via gate-voltage bias.

Challenges experienced in the related art include an inability to implement graphene and nanoparticles for color filtration. Therefore, a need exists in the related art for the improving color filtration techniques for photodetection.

SUMMARY OF INVENTION

To address at least the needs in the related art, a graphene device for filtering color, comprises a graphene structure responsive to continuous in-situ electrical gate-tuning of a Fermi level thereof and a plurality of nanoparticles disposed in relation to the graphene structure, each portion of the plurality of nanoparticles having a distinct energy bandgap in relation to another portion of the plurality of nanoparticles, and each portion of the plurality of nanoparticles configured to one of activate and deactivate in relation to the distinct energy bandgap and in response to the in-situ electrical gate-tuning of the Fermi level of the graphene structure, in accordance with an embodiment of the present disclosure.

BRIEF DESCRIPTION OF THE DRAWING(S)

The above, and other, aspects, features, and benefits of several embodiments of the present disclosure are further understood from the following Detailed Description of the Invention as presented in conjunction with the following drawings.

Figures 2A, 2B, 2C:
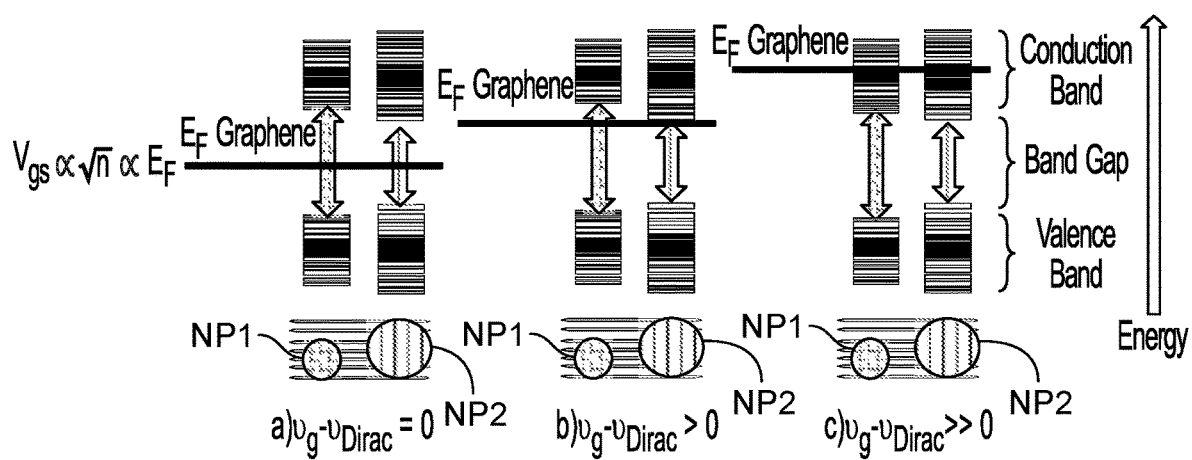

FIG. 2A is a diagram illustrating the behavior of a graphene device, comprising a graphene structure and a plurality of nanoparticles of various sizes and energy bandgaps deposited on the graphene structure, wherein the Fermi energy level is situated at $E_F=0$, wherein both Nanoparticle 1 (NP1) optical transition and Nanoparticle 2 (NP2) optical transition are allowed, in accordance with an embodiment of the present disclosure.

FIG. 2B is a diagram illustrating the behavior of a graphene device, comprising a graphene structure and a plurality of nanoparticles of various sizes and energy bandgaps deposited on the graphene structure, wherein the Fermi energy level relationship is $E_F>E_{NP2}$, $E_F<E_{NP1}$, wherein the quantum energy state of NP2 is blocked and cannot absorb photons, in accordance with an embodiment of the present disclosure.

FIG. 2C is a diagram illustrating the behavior of a graphene device, comprising a graphene structure and a plurality of nanoparticles of various sizes and energy bandgaps deposited on the graphene structure, wherein the Fermi energy level relationship is $E_F>E_{NP1}$ and $E_{NP2}$, wherein both NP1 and NP2 quantum energy states are blocked, and wherein both NP1 and NP2 optical transitions are not allowed due to the Pauli-blocking effect, in accordance with an embodiment of the present disclosure.

Figure 3:
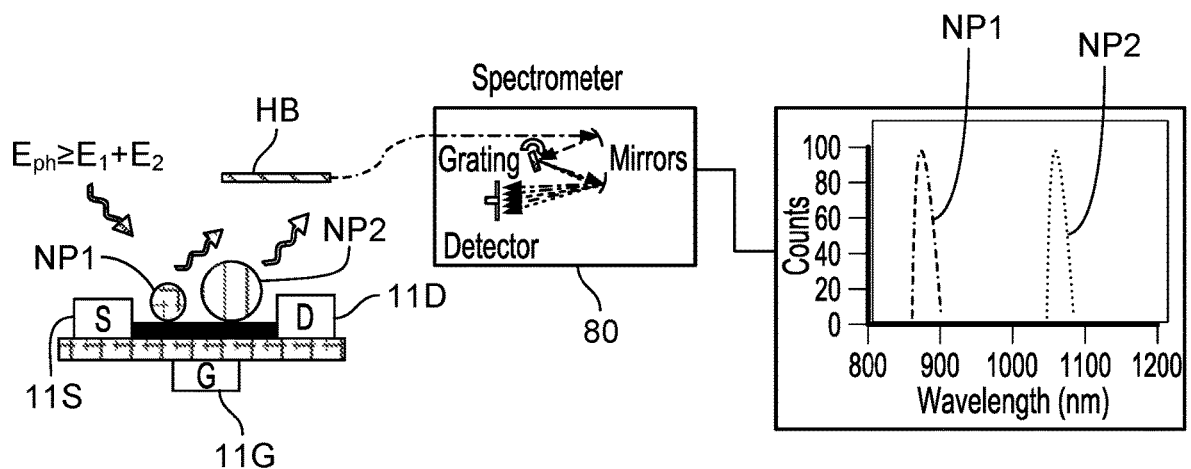

FIG. 3 is a diagram illustrating an experimental setup for performing the experiment, using a graphene device, as shown in FIGS. 2A-2C, wherein optical transitions are monitored via photoluminescence from nanoparticles with a spectrometer, in accordance with an embodiment of the present disclosure.

Figure 4:
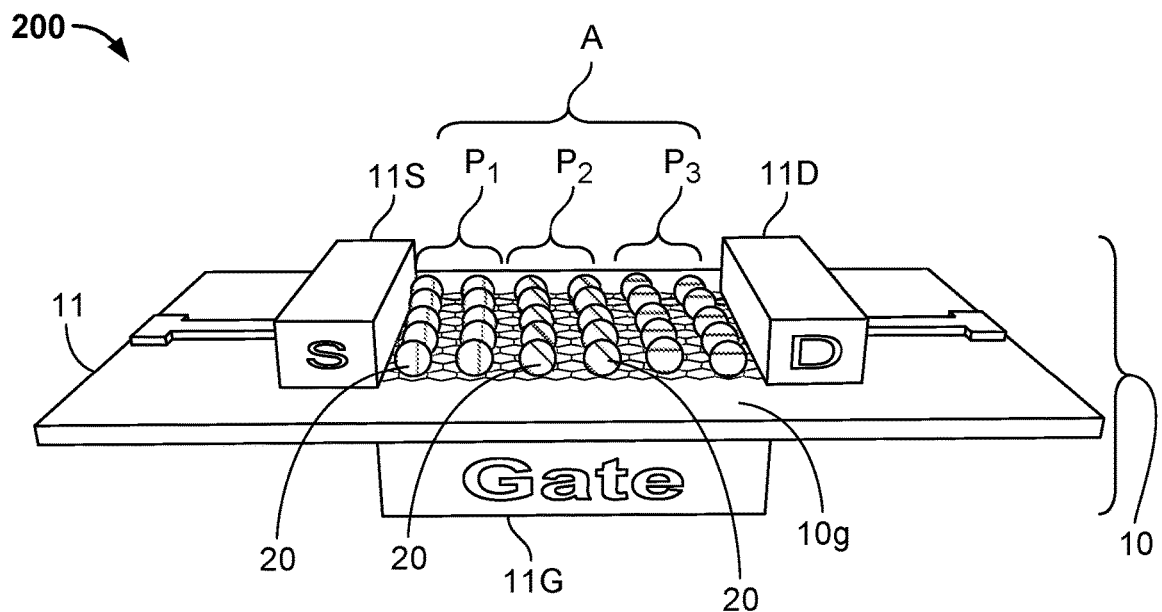

FIG. 4 is a diagram illustrating, in a perspective view, a graphene device, comprising a graphene structure and a plurality of nanoparticles are arranged in a color array on the graphene structure, in accordance with another alternative embodiment of the present disclosure.

Figure 5:
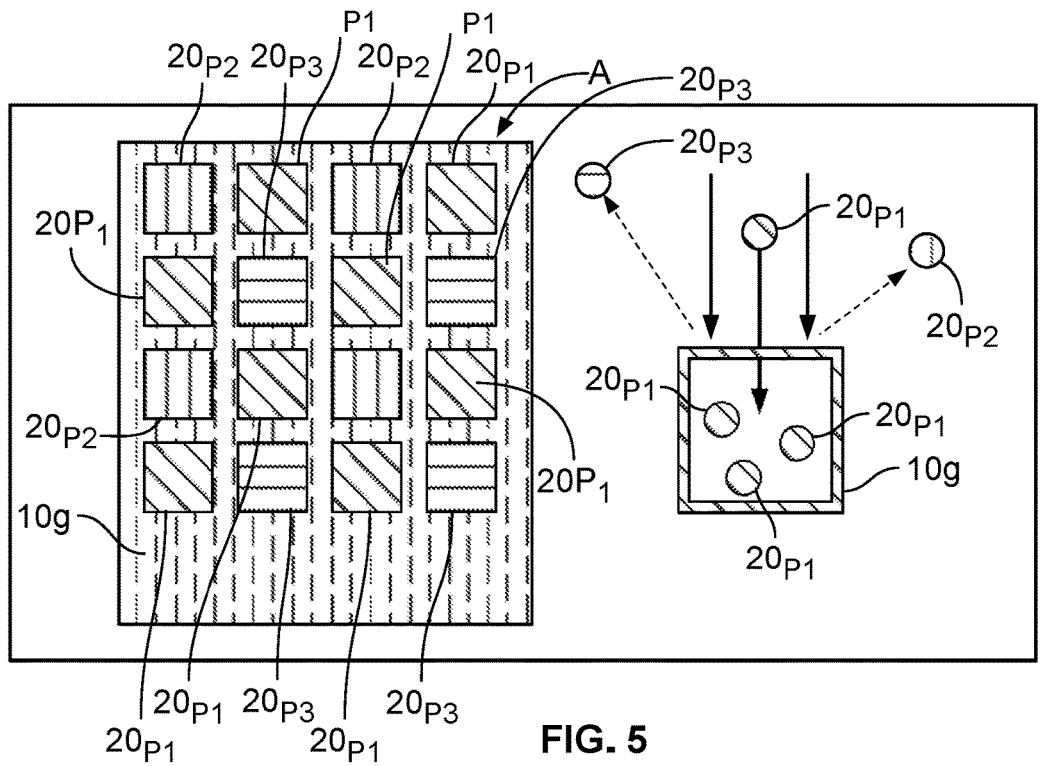

FIG. 5 is a diagram illustrating, in a partial plan view, a color array on the graphene structure of a graphene device, in accordance with another alternative embodiment of the present disclosure.

Figure 6:
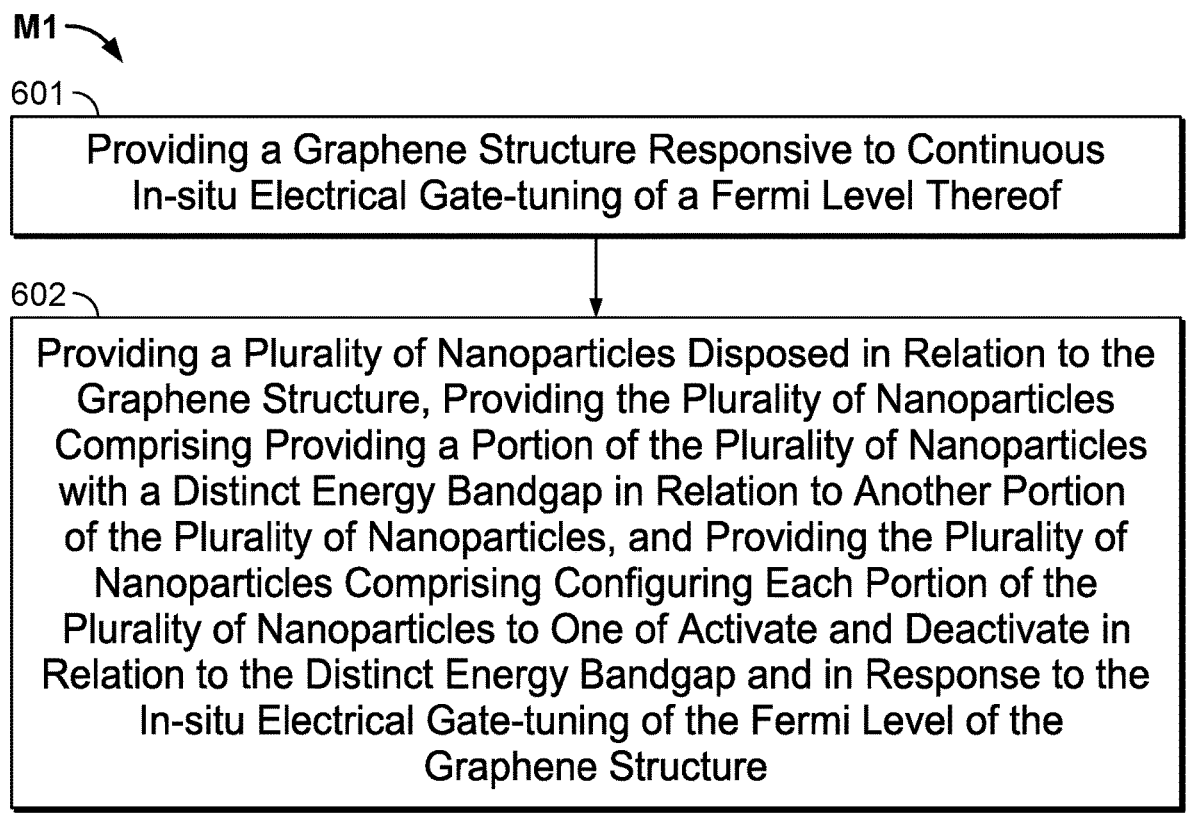

FIG. 6 is a flow diagram illustrating a method of fabricating a graphene device for filtering color, in accordance with an embodiment of the present disclosure.

Figure 7:
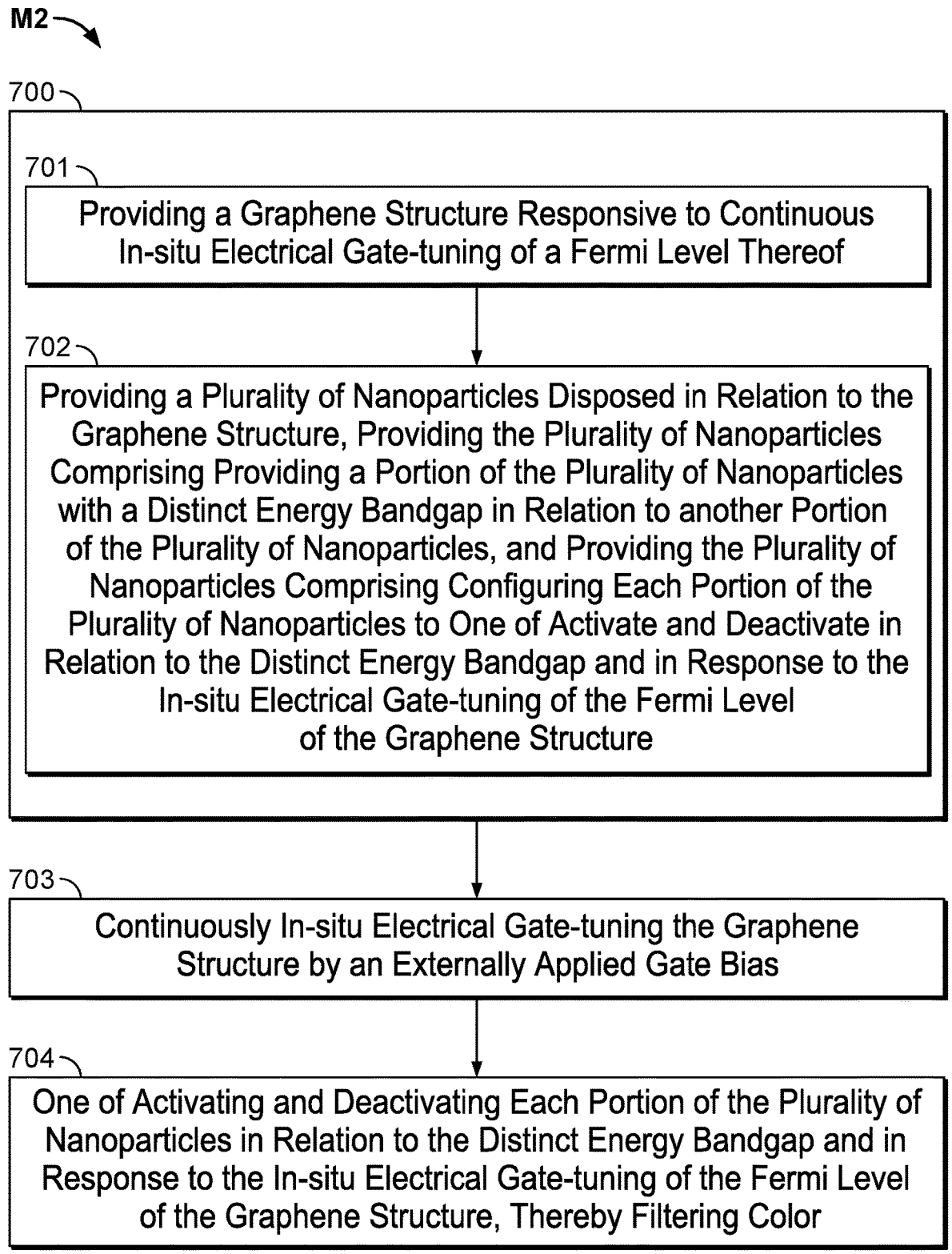

FIG. 7 is a flow diagram illustrating a method of filtering color by way of a graphene device, in accordance with an embodiment of the present disclosure.

Corresponding reference numerals or characters indicate corresponding components throughout the several figures of the Drawing. Elements in the several figures are illustrated for simplicity and clarity and have not necessarily been drawn to scale. For example, the dimensions of some of the elements in the figures may be emphasized relative to other elements for facilitating understanding of the various presently disclosed embodiments. Also, common, but well-understood, elements that are useful or necessary in commercially feasible embodiment are often not depicted in order to facilitate a less obstructed view of these various embodiments of the present disclosure.

DETAILED DESCRIPTION OF THE EMBODIMENT(S)

Generally, the present disclosure involves a device, system, and methods for electrically filtering quantum states of individual nanoparticle absorbers by tuning the Fermi energy level of a nearby, or adjacent, graphene structure. The graphene structure serves as a tunable platform or substrate upon which various nanoparticles, e.g., differing in at least one of size, shape, and material composition, are disposed, e.g., deposited. An externally applied gate bias effectively filters the excited states of these individual nanoparticles to achieve color sensitivity for filtering color.

In addition, the device, system, and methods of the present disclosure utilizes graphene's broadband absorption, the high photoluminescence of nanoparticles, and the resonance between nanoparticles and graphene to produce a low SWaP color filter that is responsive to in-situ tuning in relation to particular frequencies that are determined by the energy bandgaps of the nanoparticles. A cluster of nanoparticles, having a variety of wavelengths and corresponding frequencies, e.g. energy bandgaps, is deposited on a graphene structure. In-situ electrical gate tuning of the graphene structure's Fermi level, e.g., by an external source, is performed to one of the nanoparticles in order to activate and deactivate the different nanoparticles' photon absorption capability, thereby effecting a color filter configured to span across the frequency ranges of the selected nanoparticles, e.g., electrically addressing a static optical resonance among a variety of static optical resonances, for photodetection.

Figure 1A:
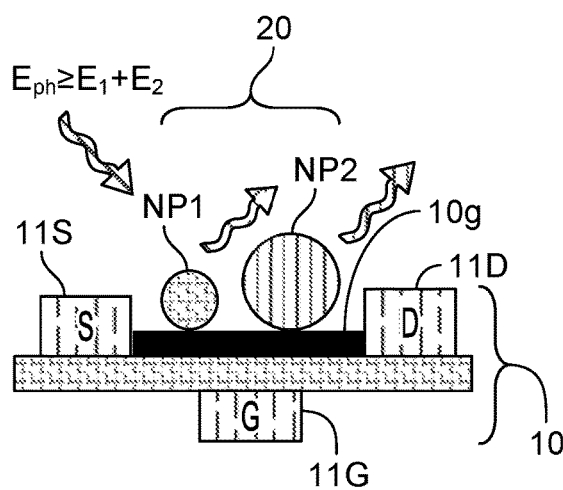
FIG. 1A is a diagram, in a side view, illustrating a graphene device for filtering color, comprising a graphene structure and a plurality of nanoparticles of various sizes and energy bandgaps deposited on the graphene structure, wherein the graphene structure comprises a graphene field effect transistor (FET) architecture, in accordance with an embodiment of the present disclosure.

Referring to FIG. 1A, this diagram illustrates, in a side view, a graphene device 100 for filtering color, comprising: a graphene structure 10 responsive to continuous in-situ electrical gate-tuning of a Fermi level thereof; and a plurality of nanoparticles 20, e.g., nanoparticles NP1, NP2, disposed in relation to the graphene structure 10, each portion of the plurality of nanoparticles 20, e.g., nanoparticle NP1, having a distinct energy bandgap in relation to another portion of the plurality of nanoparticles 20, e.g., nanoparticle NP2, and each portion of the plurality of nanoparticles 20 configured to one of activate and deactivate in relation to the distinct energy bandgap and in response to the in-situ electrical gate-tuning of the Fermi level of the graphene structure 10, in accordance with an embodiment of the present disclosure. By example only, the graphene structure 10 comprises a graphene field-effect transistor (FET) 11, having a source 11S, a drain 11D, and a gate 11G, coupled with a graphene material 10g, e.g., a graphene layer or a graphene monolayer. For example, the plurality of nanoparticles 20 have various sizes and energy bandgaps and are deposited on the graphene material 10g of the graphene structure 10 having a graphene FET architecture.

Figure 1B:
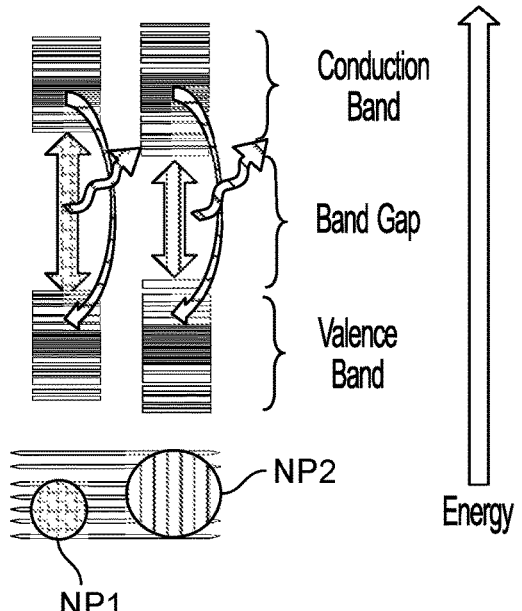
FIG. 1B is an energy band diagram illustrating the behavior of a graphene device, comprising a graphene structure and a plurality of nanoparticles of various sizes and energy bandgaps deposited on the graphene structure, wherein the graphene structure comprises a graphene field effect transistor (FET) architecture, in accordance with an embodiment of the present disclosure.

Referring to FIG. 1B, is an energy band diagram illustrating photoluminescence of a plurality of nanoparticles 20, e.g., nanoparticles NP1, NP2, as a direct result of photon absorption from an excitation light source which features a photon energy higher than all of the individual nanoparticles 20, as shown in FIG. 1A, in accordance with an embodiment of the present disclosure. A technique is utilized by embodiments of the present disclosure for selectively filtering, e.g., blocking or allowing, the excited states of the nanoparticles 20 by using at least one of electrostatic features and chemical doping of a graphene structure 10, e.g., doping a graphene monolayer. The linear dispersion relation of graphene structure 10 allows for the effective tuning of the graphene structure's Fermi energy level by applying gate bias. By applying a positively-biased gate voltage to the graphene structure 10, the graphene structure's Fermi level increases until this Fermi level surpasses and fills the first excited state of a particular nanoparticle 20 with electrons, thereby drastically reducing the graphene structure's photon absorption capability via a Pauli-blocking effect. In this circumstance, the particular nanoparticle 20 becomes transparent to the excitation photons; and only the other neighboring nanoparticles 20 with larger bandgaps continue to absorb photons from the excitation source. The photon absorption from the other nanoparticles 20 can be selectively diminished as the Fermi energy level of graphene structure 10 continues to increase over their individual excited state energies. In combination with chemical doping, the Fermi level shifts are achieved from the infrared to the visible spectral range. These techniques are utilized by a solution-processable, ultra-compact, and electrically tunable color filter, such as implemented in the embodiments of the present disclosure.

Referring to FIGS. 1A and 1B, together, graphene has a linearly dispersive energy band structure, a two-dimensional nature, and a semi-metallic behavior; and a graphene structure's Fermi energy level is continuously tuned via applying a gate voltage between a valence band (p-doped) to a conduction band (n-doped). The relation between the applied voltage-bias $v_g$ and the graphene Fermi energy level $E_F$ is given by the following expression:

$$E_F = \hbar v_F k_F = \hbar v_F \sqrt{\pi n} = \hbar v_F \sqrt{\pi \frac{\varepsilon_o \varepsilon_r v_{gs}}{qt}},$$

wherein $\hbar$ is the reduced Planck's constant, $v_F$ is the Fermi velocity for graphene's massless Dirac fermions, n is the carrier concentration, q is the elementary electronic charge, t is the thickness of the dielectric, and $\varepsilon_o$, $\varepsilon_r$ are the permittivity of free space and the dielectric, respectively. A dielectric material, through which the gate voltage is applied, is selected for a large dielectric constant in order to one of greatly shift and greatly increase the graphene Fermi energy level of the graphene to higher energies. The embodiments of the present disclosure involve applying positive gate biases, e.g., n-doping the graphene, wherein the excited quantum states of the nanoparticles 20 contribute to photon absorption at the respective characteristic resonance of the nanoparticles 20, e.g., as determined by their respective energy bandgap.

Still referring to FIGS. 1A and 1B, together, and ahead to FIG. 2A-2C, by example only, in embodiments of the present disclosure, illumination is provided by way of an excitation photon source with photon energy larger than all of the bandgaps of the nanoparticles 20 which are dispersed onto the graphene, in accordance with some embodiment of the present disclosure. Hence, all of the different nanoparticles 20 contribute to photon absorption. At this state, the graphene structure 10 has its highest absorption or its lowest transparency. As the Fermi energy level of graphene structure 10 is raised above the excited state of the first nanoparticle 20, the photon absorption contribution from this particular nanoparticle 20 or an aggregate of nanoparticles 20, e.g., various nanoparticles 20 of the same type, is drastically reduced due to the Pauli-blocking effect, e.g. the Pauli Exclusion Principle. Only the remaining nanoparticles with higher energy excited states, e.g., which act as currently empty since the Fermi level is below that of the remaining nanoparticles 20, continue to absorb photons from the excitation source. The Fermi level of the graphene structure 10 is then increased to selectively block the next nanoparticle's first excited quantum state. This process is continued until all of the nanoparticles 20 are filtered, assuming the graphene structure's Fermi level can reach the energies necessary to block the nanoparticles' higher energy excited states. Thus, a graphene device 100, comprising the graphene structure 10, acts as an ultra-compact and electrically-driven color filter.

Referring to FIGS. 2A-2C, together, these diagrams, together, illustrate the behavior of a graphene device 100, comprising a graphene structure 10 and a plurality of nanoparticles 20 of various sizes and energy bandgaps deposited on the graphene structure 10, the graphene structure 10 configured to selective filter individual nanoparticles 20 with the application of a gate-source voltage from a graphene FET architecture, in accordance with some embodiments of the present disclosure. In FIGS. 2A-2C, $v_g - v_{Dirac}$ is the effective electrostatic doping of graphene, wherein $v_{Dirac}$ is the Dirac point, e.g., the charge-neutrality point, of graphene. The value of $v_{Dirac}$ varies; and the Fermi level depends on the difference between the gate voltage, $v_g$, and the Dirac point, $v_{Dirac}$.

Referring to FIG. 2A, this diagram illustrates the behavior of a graphene device 100, comprising a graphene structure 10 and a plurality of nanoparticles 20 of various sizes and energy bandgaps deposited on the graphene structure 10, wherein the Fermi energy level is situated at $E_F=0$, and wherein both Nanoparticle 1 (NP1) optical transition and Nanoparticle 2 (NP2) optical transition are allowed, in accordance with an embodiment of the present disclosure.

Referring to FIG. 2B, this diagram illustrates the behavior of a graphene device 100, comprising a graphene structure 10 and a plurality of nanoparticles 20 of various sizes and energy bandgaps deposited on the graphene structure 10, wherein the Fermi energy level relationship is $E_F>E_{NP2}$, $E_F<E_{NP1}$, and wherein the quantum energy state of NP2 is blocked and cannot absorb photons, in accordance with an embodiment of the present disclosure. The optical transition of nanoparticle NP1 is allowed since the graphene Fermi level lies below this energy state.

Referring to FIG. 2C, this diagram illustrates the behavior of a graphene device 100, comprising a graphene structure 10 and a plurality of nanoparticles 20 of various sizes and energy bandgaps deposited on the graphene structure 10, wherein the Fermi energy level relationship is $E_F>E_{NP1}$ and $E_{NP2}$, wherein quantum energy states of both nanoparticles NP1, NP2 are blocked, and wherein optical transitions of both nanoparticles NP1, NP2 are not allowed due to the Pauli-blocking effect, in accordance with an embodiment of the present disclosure.

Referring to FIG. 3, this diagram illustrates an experimental setup for performing the experiment, using a graphene device 100, having the selective filtering behavior, as shown in FIGS. 2A-2C, in accordance with an embodiment of the present disclosure. In this experiment, optical transitions are monitored via photoluminescence from nanoparticles 20 by a spectrometer 80. The horizontal bar HB indicates an optical fiber to couple the light with the spectrometer 80. The gate-variable photoluminescence (PL) spectra of the composite device is analyzable, e.g., with all of the different nanoparticles 20 on the graphene structure 10 initially contributing to PL resonances due to all of the different nanoparticles 20 absorbing the excitation photons due to their respective energy bandgaps. In this circumstance, various PL peaks would occur in the spectrum. As the Fermi level of the graphene structure 10 is progressively increased in order to block the first excited states of the different nanoparticles 20, the respective PL peaks would disappear in the spectrum. Hence, this graphene device 100 selectively filters individual nanoparticles 20 from a variety of nanoparticles 20 that are dispersed on the graphene structure 10.

The embodiments of the present disclosure overcome many of the related art challenges by selectively blocking the excited quantum states of each portion of the plurality of nanoparticles 20. Moreover, embodiments of the present disclosure apply photoluminescence at varying incident frequencies, e.g., not being fixed in frequency, after the graphene device is fabricated. By selectively blocking excited states of each portion of the plurality of nanoparticles 20, an ultra-compact and electrically-driven color filter or variable transparency coating, e.g., for energy efficient smart windows, is provided. Furthermore, the embodiments of the present disclosure overcome many of the related art challenges faced by using a single nanoparticle or uniform nanoparticles.

The embodiments of the present disclosure further encompass features, such as flexible and variable transparency optoelectronic fabrics, wherein such fabrics comprise various nanomaterials, e.g., nanoparticles, graphene, and the like, for low SWaP-C. For example, embodiments of the present disclosure are implementable in relation to military applications, e.g., for flexible night-vision, wherein the plurality of nanoparticles 20 comprises plurality of infrared (IR) nanoparticles. The embodiments of the present disclosure further encompass features, such as in-situ optical resonance frequency selection, e.g. filtering, through gate-voltage bias among a discrete set of optical resonances. e.g., as set by the energy bandgaps of the plurality of nanoparticles 20.

In accordance with an alternative embodiment of the present disclosure, the graphene device architecture comprises at least one of high-K dielectrics (not shown) and ionic liquid gels (not shown) to achieve Pauli-blocking at higher Fermi energy levels within the conduction band, e.g., n-doping. In accordance with another alternative embodiment of the present disclosure, the nanoparticles 20 can be replaced with alternative optical absorbers (not shown), e.g. nanomaterials with various sizes. In accordance with another alternative embodiment of the present disclosure, the graphene device architecture is integrated into any other electronic architecture that includes graphene and a structure configured to perform at least one of actuate, vary, and stimulate the Fermi level of graphene. In accordance with another alternative embodiment of the present disclosure, the number of distinct nanoparticle bandgaps is not limited to two but may be more, e.g., any number of distinct bandgap absorbers are selectable for fabricating a desired graphene system. In accordance with another alternative embodiment of the present disclosure, the Fermi level modulation source is not restricted to voltage bias or chemical doping. The Fermi level can also be modulated by an externally applied electric field, e.g., via photons.

Referring to FIG. 4, this diagram illustrates, in a perspective view, a graphene device 200, comprising a graphene structure 10 and a plurality of nanoparticles 20 are arranged in a color array A disposed in relation to, or deposited on, the graphene structure 10, wherein the graphene structure 10 comprises a graphene field-effect transistor (FET) 11, having a source 11S, a drain 11D, and a gate 11G, coupled with a graphene material 10g, e.g., a graphene layer or a graphene monolayer. For example, each portion P1, P2, P3 of the plurality of nanoparticles 20 has a distinct size and energy bandgap in relation to another portion of the plurality of nanoparticles 20 and is deposited on the graphene material 10g of the graphene structure 10 having a graphene FET architecture, in accordance with another alternative embodiment of the present disclosure. The color array A is not limited to visible range and is extendable to at least one of an ultraviolet (UV) spectral range and an infrared (IR) spectral range.

Referring to FIG. 5, this diagram illustrates a plan view of a color array A on the graphene structure 10 of a graphene device 200, as shown in FIG. 4, in accordance with another alternative embodiment of the present disclosure. This color array A is also not limited to visible range and is extendable to at least one of an ultraviolet (UV) spectral range and an infrared (IR) spectral range. By example only, the color array may comprise quantum dots 20 corresponding at least three colors.

Referring to FIG. 6, this flow diagram illustrates a method M1 of fabricating a graphene device 100 for filtering color, comprising: providing a graphene structure 10 responsive to continuous in-situ electrical gate-tuning of a Fermi level thereof, as indicated by block 601; and providing a plurality of nanoparticles 20 disposed in relation to the graphene structure 10, providing the plurality of nanoparticles 20 comprising providing a portion of the plurality of nanoparticles 20 with a distinct energy bandgap in relation to another portion of the plurality of nanoparticles 20, and providing the plurality of nanoparticles 20 comprising configuring each portion of the plurality of nanoparticles 20 to one of activate and deactivate in relation to the distinct energy bandgap and in response to the in-situ electrical gate-tuning of the Fermi level of the graphene structure 10, as indicated by block 602, in accordance with an embodiment of the present disclosure.

Still referring to FIG. 6, in the method M1, providing the graphene structure 10, as indicated by block 601, comprises providing one of a graphene monolayer and a field-effect transistor architecture. Providing the plurality of nanoparticles 20, as indicated by block 602, comprises providing each portion of the plurality of nanoparticles 20 with at least one of a distinct size, a distinct shape, and a distinct material composition, in relation to another portion of the plurality of nanoparticles 20. Providing the plurality of nanoparticles 20, as indicated by block 602, comprises configuring each portion of the plurality of nanoparticles 20 to become transparent to photons from an excitation source corresponding to the distinct energy bandgap thereof. Providing the plurality of nanoparticles, as indicated by block 602, comprises configuring another portion of the plurality of nanoparticles 20, having a distinct energy bandgap larger than that of each portion of the of the plurality of nanoparticles 20 becoming transparent, to continue absorbing photons from the excitation source.

Still referring to FIG. 6, in the method M1, providing the plurality of nanoparticles 20, as indicated by block 602, comprises providing the plurality of nanoparticles 20 as photoluminescent. Providing the graphene structure, as indicated by block 601, comprises providing the graphene structure 10 as responsive to in-situ electrical gate-tuning comprising an externally applied gate bias, whereby an excited state of each portion of the plurality of nanoparticles 20 effectively filters light to achieve color sensitivity. Providing the graphene structure, as indicated by block 601, further comprises providing at least one of an electrostatic feature and a chemical dopant. Providing the plurality of nanoparticles, as indicated by block 602, comprises configuring each portion of the plurality of nanoparticles 20 to one of block and allow the excited state thereof by using at least one of the electrostatic feature and the chemical dopant in the graphene structure.

Still referring to FIG. 6, in the method M1, providing the graphene structure 10, as indicated by block 601, further comprises configuring the graphene structure 10 as responsive to continuous in-situ electrical gate-tuning of the Fermi level, the tuning being shiftable from an infrared spectral range to a visible spectral range. Providing the graphene structure 10, as indicated by block 601, further comprises providing the graphene structure 10 as one of n-doped and p-doped. Providing the graphene structure 10, as indicated by block 601, further comprises configuring the graphene structure 10 as responsive to increasing the Fermi level to selectively block a next nanoparticle's first excited quantum state, whereby all of the nanoparticles 20 are filtered.

Still referring to FIG. 6, in the method M1, providing the graphene structure 10, as indicated by block 601, further comprises providing at least one of a flexible and variable transparency optoelectronic fabric, a high-K dielectric material, and an ionic liquid gel. Providing the fabric comprises providing at least one nanomaterial. Providing the plurality of nanoparticles 20, as indicated by block 602, comprises providing a plurality of infrared (IR) nanoparticles. Providing the plurality of nanoparticles, as indicated by block 602, comprises arranging the plurality of nanoparticles 20 in a color array A on the graphene structure 10. Arranging the plurality of nanoparticles 20 in the color array A comprises extending operation to at least one of a visible (Vis) spectral range, an ultraviolet (UV) spectral range and an infrared (IR) spectral range. Providing the graphene structure 10, as indicated by block 601, further comprises configuring the graphene structure 10 as responsive to modulation the Fermi level by an external electric field. In an alternative embodiment, the method M1 further comprises providing an in-situ optical resonance frequency selection feature.

Referring to FIG. 7, this flow diagram illustrates a method M2 of filtering color by way of a graphene device 100, comprising: providing the graphene device 100, as indicated by block 700, providing the graphene device 100 comprising: providing a graphene structure 10 responsive to continuous in-situ electrical gate-tuning of a Fermi level thereof, as indicated by block 701; and providing a plurality of nanoparticles 20 disposed in relation to the graphene structure 10, providing the plurality of nanoparticles 20 comprising providing each portion of the plurality of nanoparticles 20 with a distinct energy bandgap in relation to another portion of the plurality of nanoparticles 20, and providing the plurality of nanoparticles 20 comprising configuring each portion of the plurality of nanoparticles 20 to one of activate and deactivate in relation to the distinct energy bandgap and in response to the in-situ electrical gate-tuning of the Fermi level of the graphene structure 10, as indicated by block 702; continuously in-situ electrical gate-tuning the graphene structure 10 by an externally applied gate bias, as indicated by block 703; and one of activating and deactivating each portion of the plurality of nanoparticles 20 in relation to the distinct energy bandgap and in response to the in-situ electrical gate-tuning of the Fermi level of the graphene structure 10, thereby filtering color, as indicated by block 704, in accordance with an embodiment of the present disclosure.

Understood is that many additional changes in the details, materials, steps and arrangement of parts, which have been herein described and illustrated to explain the nature of the invention, may be made by those skilled in the art within the principle and scope of the invention as expressed in the appended claims.

What is claimed:

1. A graphene device for filtering color, comprising:
a graphene structure responsive to continuous in-situ electrical gate-tuning of a Fermi level thereof; and
a plurality of nanoparticles disposed adjacent the graphene structure, the plurality of nanoparticles included in a plurality of groups, each of the plurality of groups associated with a respective bandgap from a plurality of distinct energy bandgaps, the nanoparticles in each group of the plurality of groups having the respective bandgap for the group, and the nanoparticles in each group of the plurality of groups configured to activate and deactivate in response to a position, from the continuous in-situ electrical gate-tuning, of the Fermi level of the graphene structure relative to the respective bandgap for the group.

2. The device of claim 1,
wherein the graphene structure comprises one of a graphene monolayer and a field-effect transistor architecture,
wherein the nanoparticles in each of the plurality of groups comprises at least one of a distinct size, a distinct shape, or a distinct material composition, in relation to the nanoparticles in each other one of the plurality of groups,
wherein the nanoparticles in a first group of the plurality of groups is configured to become transparent to photons from an excitation source corresponding to the respective bandgap for the first group, and
wherein the nanoparticles in a second group of the plurality of groups, having the respective bandgap larger than the respective bandgap of the nanoparticles in the first group becoming transparent, continue absorbing photons from the excitation source.

3. The device of claim 1,
wherein the plurality of nanoparticles are photoluminescent, and
wherein the continuous in-situ electrical gate-tuning comprises an externally applied gate bias,
whereby an excited state of the nanoparticles in each of the plurality of groups filters light to achieve color sensitivity, which can be seen as a change in photoresponse of the device to excitation sources of different wavelength.

4. The device of claim 3,
wherein the graphene structure further comprises at least one of a chemical dopant or an electrostatic feature, which provides the externally applied gate bias of the continuous in-situ electrical gate tuning, and
wherein the nanoparticles in each of the plurality of groups is configured to block and allow the excited state thereof by using at least one of the electrostatic feature or the chemical dopant in the graphene structure.

5. The device of claim 4, wherein the continuous in-situ electrical gate tuning of the Fermi level is shiftable across at least one of an electromagnetic spectrum, an infrared spectrum, a visible spectrum, or an ultraviolet spectrum.

6. The device of claim 4, wherein the graphene structure is one of n-doped and p-doped.

7. The device of claim 1, wherein if the Fermi level of the graphene structure increases until a first excited quantum state of the nanoparticles in each of the plurality of groups becomes selectively blocked, then all of the plurality of nanoparticles become deactivated and transparent.

8. The device of claim 1, wherein at least one of:
the graphene structure further comprises at least one of a flexible and variable transparency optoelectronic fabric, a high-K dielectric material, or an ionic liquid gel, wherein the fabric comprises at least one nanomaterial,
the plurality of nanoparticles comprises at least one of a plurality of infrared (IR) nanoparticles, a plurality of quantum dots, a plurality of nanorods, or a plurality of perovskite nanoparticles, and
the plurality of nanoparticles are arranged in a color array on the graphene structure, and the color array is extendable to at least one of a visible (Vis) spectral range, an ultraviolet (UV) spectral range or an infrared (IR) spectral range.

9. The device of claim 1, wherein the Fermi level is further modulated by an external electric field.

10. The device of claim 1, further comprising an in-situ optical resonance frequency selection feature.

11. A method of fabricating a graphene device for filtering color, comprising:
providing a graphene structure responsive to continuous in-situ electrical gate-tuning of a Fermi level thereof; and
providing a plurality of nanoparticles disposed adjacent the graphene structure, the plurality of nanoparticles included in a plurality of groups, each of the plurality of groups associated with a respective bandgap from a plurality of distinct energy bandgaps, the nanoparticles in each group of the plurality of groups having the respective bandgap for the group, and the nanoparticles in each group of the plurality of groups configured to activate and deactivate in response to a position, from the continuous in-situ electrical gate-tuning, of the Fermi level of the graphene structure relative to the respective bandgap for the group.

12. The method of claim 11,
wherein providing the graphene structure comprises providing one of a graphene monolayer and a field-effect transistor architecture,
wherein providing the plurality of nanoparticles comprises providing the nanoparticles in each of the plurality of groups with at least one of a distinct size, a distinct shape, or a distinct material composition, in relation to the nanoparticles in each other one of the plurality of groups, wherein providing the plurality of nanoparticles comprises configuring the nanoparticles in a first group of the plurality of groups to become transparent to photons from an excitation source corresponding to the respective bandgap for the first group, and wherein providing the plurality of nanoparticles comprises configuring the nanoparticles in a second group of the plurality of groups, having the respective bandgap larger than the respective bandgap of the nanoparticles in the first group becoming transparent, to continue absorbing photons from the excitation source.

13. A method of filtering color by way of a graphene device, comprising:

providing the graphene device, the providing of the graphene device comprising:

providing a graphene structure responsive to continuous in-situ electrical gate-tuning of a Fermi level thereof; and providing a plurality of nanoparticles disposed adjacent the graphene structure, the plurality of nanoparticles included in a plurality of groups, each of the plurality of groups associated with a respective bandgap from a plurality of distinct energy bandgaps, the nanoparticles in each group of the plurality of groups having the respective bandgap for the group, and the nanoparticles in each group of the plurality of groups configured to activate and deactivate in response to a position, from the continuous in-situ electrical gate-tuning, of the Fermi level of the graphene structure relative to the respective bandgap for the group;

continuously in-situ electrical gate-tuning the graphene structure by an externally applied gate bias; and activating and deactivating the nanoparticles in response to the continuously in-situ electrical gate-tuning of the Fermi level of the graphene structure by the externally applied gate bias, thereby filtering color.

14. A device for filtering light, comprising:
a graphene layer having a Fermi level;
a gate layer for applying a voltage bias between the gate layer and the graphene layer;
a dielectric layer between the gate layer and the graphene layer, wherein the Fermi level in the graphene layer depends on an internal electric field conveyed through the dielectric layer in response to the voltage bias applied between the gate layer and graphene layer; and
a plurality of nanoparticles disposed adjacent the graphene layer with each of the nanoparticles having a respective bandgap, wherein a photon absorption across the respective bandgap of each of the nanoparticles is activated when the Fermi level of the graphene layer is within the respective bandgap, and the photon absorption across the respective bandgap of each of the nanoparticles is deactivated when the Fermi level of the graphene layer is above the respective bandgap, wherein the plurality of nanoparticles are included in a plurality of element groups of a color array, and the plurality of element groups are included in a plurality of color groups of the color array, each color group of the plurality of color groups including the nanoparticles included in each of the element groups included in the color group;

each color group of the plurality of color groups is associated with a respective shared bandgap from a plurality of distinct energy bandgaps, and the respective bandgap of the nanoparticles included in the color group is the respective shared bandgap of the color group; and each nanoparticle of the plurality of nanoparticles becomes relatively absorbing of the light having a wavelength corresponding to the respective bandgap of the nanoparticle when the photon absorption across the respective bandgap of the nanoparticle is activated, and each nanoparticle of the plurality of nanoparticles becomes relatively transparent to the light having the wavelength corresponding to the respective bandgap of the nanoparticle when the photon absorption across the respective bandgap of the nanoparticle is deactivated.

15. The device of claim 14, wherein, in response to the voltage bias between the gate layer and graphene layer continuously increasing from a prescribed minimum to a prescribed maximum, a number of the plurality of color groups including the nanoparticles that are relatively transparent and no longer relatively absorbing monotonically increments from none of the plurality of color groups to all of the plurality of color groups.

16. The device of claim 14, wherein the wavelength corresponding to the respective bandgap of the nanoparticles included in the each of the plurality of color groups is the wavelength for the color group in at least one of an infrared (IR) spectral range, a visible (Vis) spectral range, or an ultraviolet (UV) spectral range.

17. The device of claim 14, wherein the plurality of nanoparticles is a plurality of quantum dots, and the plurality of quantum dots and the graphene structure are coupled so that the Fermi level of the graphene structure is a Fermi level of each of the plurality of nanoparticles.

18. The device of claim 14, wherein, in addition to the Fermi level of the graphene layer being modulated by the internal electric field from the voltage bias applied between the gate layer and graphene layer, the Fermi level is further modulated by each of an external electric field and a chemical dopant doping the graphene layer.

* * * * *